United States Patent [19]
Anderson et al.

[11] Patent Number: 5,179,677
[45] Date of Patent: Jan. 12, 1993

[54] APPARATUS AND METHOD FOR SUBSTRATE HEATING UTILIZING VARIOUS INFRARED MEANS TO ACHIEVE UNIFORM INTENSITY

[75] Inventors: Roger N. Anderson; Thomas E. Deacon, both of San Jose; David K. Carlson, Santa Clara, all of Calif.

[73] Assignee: Applied Materials, Inc., Santa Clara, Calif.

[21] Appl. No.: 651,668

[22] Filed: Feb. 6, 1991

Related U.S. Application Data

[63] Continuation-in-part of Ser. No. 568,393, Aug. 16, 1990, abandoned.

[51] Int. Cl.$^5$ .................. C23C 16/48; H05B 3/00; F24C 7/06
[52] U.S. Cl. .................. 392/411; 392/416; 219/405; 118/725
[58] Field of Search .................. 392/411–413, 392/416, 422, 418; 219/405, 411, 388; 118/641–642, 725, 50.1, 724; 427/55

[56] References Cited

U.S. PATENT DOCUMENTS

| | | | |
|---|---|---|---|
| 3,836,751 | 9/1974 | Anderson | 219/405 |
| 4,101,759 | 7/1978 | Anthony et al. | 219/405 |
| 4,446,358 | 5/1984 | Comerford et al. | 219/388 |
| 4,470,369 | 9/1984 | Edgerton | 118/725 |
| 4,493,977 | 1/1985 | Arai et al. | 118/725 |
| 4,545,327 | 10/1985 | Campbell et al. | 118/725 |
| 4,680,451 | 7/1987 | Gat et al. | 219/411 |
| 4,755,654 | 7/1988 | Crowley et al. | 219/405 |
| 4,789,771 | 12/1988 | Robinson et al. | 219/405 |
| 4,796,562 | 1/1989 | Brors et al. | 219/405 |
| 4,823,735 | 4/1989 | Pichel et al. | 118/64 |
| 4,836,138 | 6/1989 | Robinson et al. | 118/666 |
| 4,981,815 | 1/1991 | Kakoschke | 219/405 |
| 5,108,792 | 4/1992 | Anderson et al. | 118/725 |

FOREIGN PATENT DOCUMENTS

| | | |
|---|---|---|
| 59-36927 | 2/1984 | Japan . |
| 59-59876 | 4/1984 | Japan .................. 219/411 |
| 62-60221 | 3/1987 | Japan .................. 392/416 |

*Primary Examiner*—Bruce A. Reynolds
*Assistant Examiner*—John A. Jeffery
*Attorney, Agent, or Firm*—Paul Hentzel; Robert R. Meads

[57] ABSTRACT

A reflector array employs a number of linear, tubular heater lamps arranged in a circle concentric with the substrate to be heated. Some of the lamps have focusing reflectors and the remainder have dispersive reflectors. A peripheral cylindrical reflector surrounds the lamps and their associated reflectors. The combined reflectors permit balancing the thermal radiation intensity across the surface of the substrate.

5 Claims, 4 Drawing Sheets

APPARATUS AND METHOD FOR SUBSTRATE HEATING UTILIZING VARIOUS INFRARED MEANS TO ACHIEVE UNIFORM INTENSITY

This Application is a Continuation-in-Part of Parent application Ser. No. 07/568,393 filed on Aug. 16, 1990. now abandoned.

BACKGROUND OF THE INVENTION

The present invention relates generally to heaters useful in thermal processing apparatuses, more particularly to heaters used in the rapid thermal processing of semiconductor substrates, and especially to an apparatus and method for heating semiconductor substrates during chemical-vapor-deposition (CVD) processes, including epitaxial reaction processes. Accordingly, it will be understood that when reference is made in the remainder of this application to CVD or epitaxial deposition processes, these are merely prime examples of the range of thermal processes to which the teachings of the present invention are applicable.

The commercial production of semiconductor devices has in recent times been placed under increasing pressure to reduce the cost per device. This in turn has required new measures to increase the efficiency of epitaxial processing methods so that they yield higher throughput of acceptable devices at a lower cost per device. One important recent development in this regard is a compact, double-dome reactor which achieves increased processing speed and reduced consumption of the gases used in the epitaxial reaction.

Such an apparatus is fully detailed in a pending U.S. patent application entitled "Double-Dome Reactor for Semiconductor Processing", Ser. No. 07/491,416, filed Mar. 9, 1990, and commonly assigned with the present application. The reactor system utilized in this cited application is efficient enough to permit economic processing of even a single wafer per processing operation.

The central concepts of this double-dome reactor system may be summarized as follows: (1) support the substrate on a thin, low-mass susceptor for rapid heating and cooling; (2) enclose the substrate and susceptor in a compact housing having a pair of transparent domes, each dome covering one face of the susceptor-substrate combination; (3) provide conduits for reactant gases to enter and exit the housing; (4) provide a pair of radiant heaters arranged to project thermal radiation through each of the transparent domes to uniformly heat each face of the susceptor-substrate combination.

While the reactor system described in the above patent double dome application has proven very efficient in reducing processing cost and increasing throughput, work has continued on further improvements in these regards. The radiant heaters shown and described in the double dome patent application are of the sort which uses a pair of concentric arrays of heater lamps in a simple cylindrical reflector housing, one lamp array near the outer periphery and the other nearer the center of the cylindrically symmetric arrangement. The two arrays use different types of lamps having different radiation patterns, as shown in the drawing of the double dome patent application.

Such an arrangement achieves good radial uniformity of thermal radiation from the center to the edge of the substrate, while rotation of the substrate about the axis of cylindrical symmetry effectively cancels any azimuthal non-uniformities of radiation. However, achieving similar radial uniformity of thermal radiation without requiring two concentric arrays of heater lamps of two different types would be very desirable, since the cost of the heaters could be reduced.

SUMMARY OF THE INVENTION

An object of the present invention is to reduce the complexity of heaters used for heating a substrate in a rapid thermal processing or CVD apparatus.

Another object of the present invention is to provide such a heater in a form which heats the substrate indirectly by producing thermal radiation.

Another object of the present invention is to provide such a heater in a form which produces enhanced radial uniformity of thermal radiation over the extent of the substrate.

Another object of the present invention is to provide such a heater in a form which is more economical to manufacture than prior art heaters.

Another object of the present invention is to provide such a heater which achieves the foregoing objects with the use of a single array of heater lamps.

Another object of the present invention is to provide as a part of such a heater an improved reflector which produces enhanced radial uniformity of thermal radiation from a single array of heater lamps.

It is a further object of this invention to provide variable power supplies for controlling the heat distribution of the heater lamps.

It is a further object of this invention to provide variable power supplies for controlling the heat distribution of the heater lamps at different times during the processing.

To the above ends, a radiant heater for use in heating the substrate in a CVD apparatus, in accordance with the present invention, uses a plurality of linear, tubular heater lamps arranged in a concentric, radial array about the axis along which thermal radiations are directed toward the substrate.

Some of the lamps are provided with focusing reflectors which cause thermal radiation to be directed in parallel paths toward the substrate, resulting in greater thermal radiation near the center of the substrate. The remainder of the lamps are provided with dispersive reflectors which cause thermal radiation to be dispersed in a hemispherical radiation pattern.

A peripheral reflector circumferentially surrounding the lamps and their associated reflectors intercepts some of the dispersed radiation and redirects it into a radiation pattern which is more intense at the periphery of the substrate than at the center, balancing the pattern of radiation from the focusing reflectors.

BRIEF DESCRIPTION OF THE DRAWING

The above and other features, objects, and advantages of the present invention, together with the best mode known to the inventors for carrying out their invention, will become more apparent from reading the description of the invention which follows while studying the associated drawing, the various figures of which represent.

DETAILED DESCRIPTION OF THE INVENTION

Figure 1:
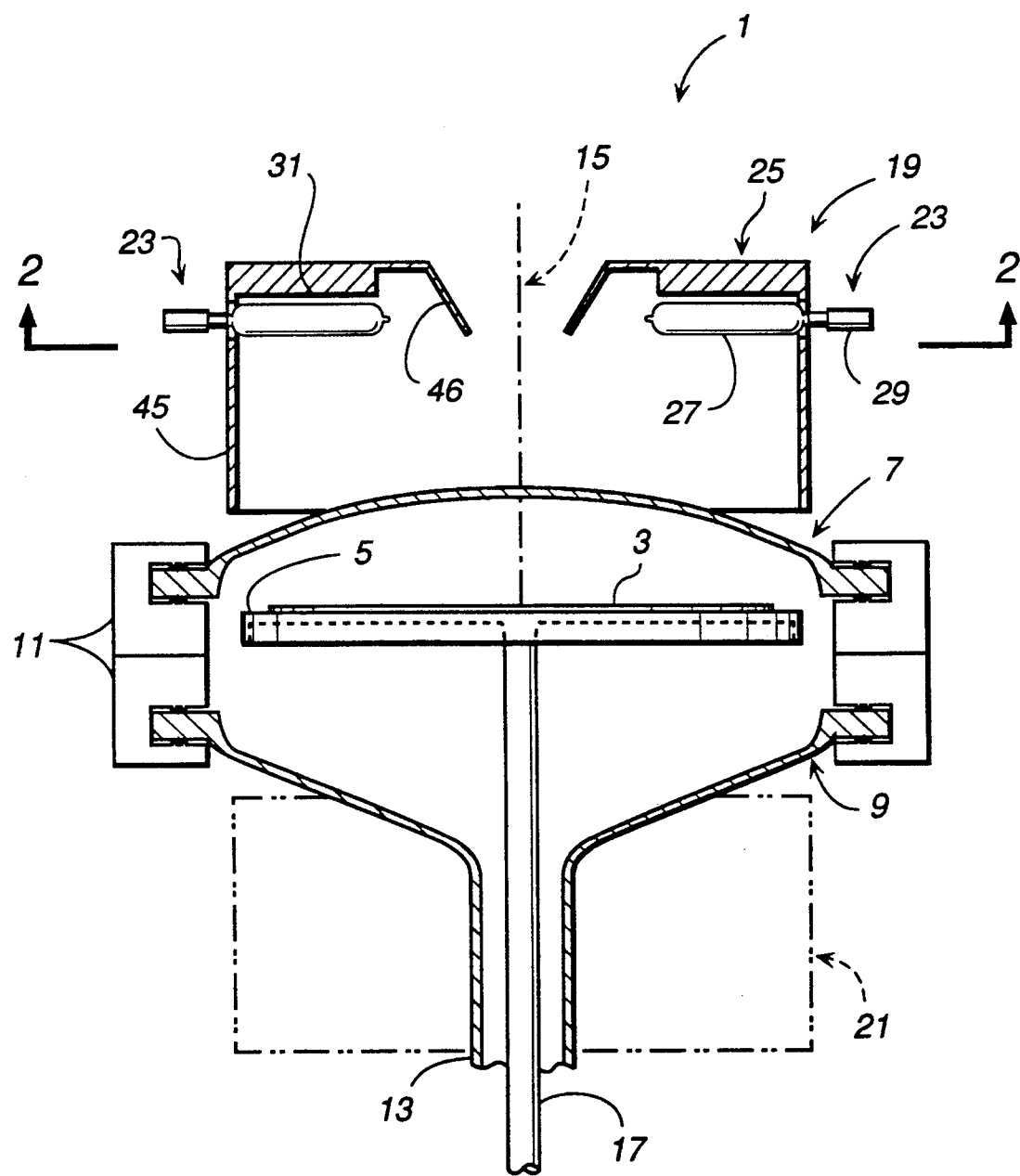
FIG. 1 is a side view, partly in elevation and partly in section, showing a heater apparatus according to the present invention.

In FIG. 1, a chemical vapor deposition (CVD) reactor vessel or other rapid thermal processing apparatus 1 is illustrated in a simplified and somewhat schematic form. A semiconductor substrate 3, which might be a thin wafer of silicon having a diameter of 200 mm, for example, is supported on a susceptor 5 mounted within the processing chamber within reactor vessel 1. Susceptor 5 is made, for example, of graphite and is in the form of a thin disc having a peripheral stiffening flange, such that it has a relatively low thermal mass.

An upper domed cover 7 made of a transparent refractory material such as quartz, for example, encloses the top surface of substrate 3 and susceptor 5, while a similar lower domed cover 9 encloses the bottom surface thereof. Edge flanges 11, illustrated in a simplified schematic form, are used to join covers 7 and 9, forming a gas-tight joint.

Although each of the domed covers 7 and 9 might be provided with a tubular neck as in the aforementioned double dome patent application, only lower cover 9 has been illustrated with a tubular neck 13 located on the axis 15 of cylindrical symmetry of the apparatus. Neck 13 may be connected to a vacuum pump, to a source of purge gas, or to a source of desired reactive gaseous atmosphere to be introduced into the apparatus. Ports (not shown) in edge flanges 11 are provided as in the aforementioned double dome patent application, and are similarly used to control the gaseous environment within the apparatus 1.

A support shaft 17 extends upwardly within the neck 13 of lower cover 9 along axis 15 to support susceptor 5 and substrate 3. Shaft 17 may be rotated during processing operations by a motor (not shown).

A heater apparatus 19 is positioned adjacent upper cover 7 for the purpose of heating substrate 3 and susceptor 5 during processing. Heater apparatus 19 projects thermal radiations in a direction generally along axis 15, and, together with a similar lower heater apparatus 21 (shown only in phantom outline) heats the substrate 3 and susceptor 5 to processing temperatures in the range of 500 to 1200 degrees Celsius.

Considered in its simplest and broadest aspect, heater apparatus 19 consists of an extended array of spaced heaters 23 and an extended reflector array 25. Heaters 23 extend radially inwardly toward axis 15 through corresponding apertures in the outer wall of extended reflector array 25. Each of these heaters 23 consists of a linear, tubular halogen-quartz lamp 27 with a tungsten filament and a socket 29 which provides mechanical support and electrical connections to the lamp 27.

Figure 2:
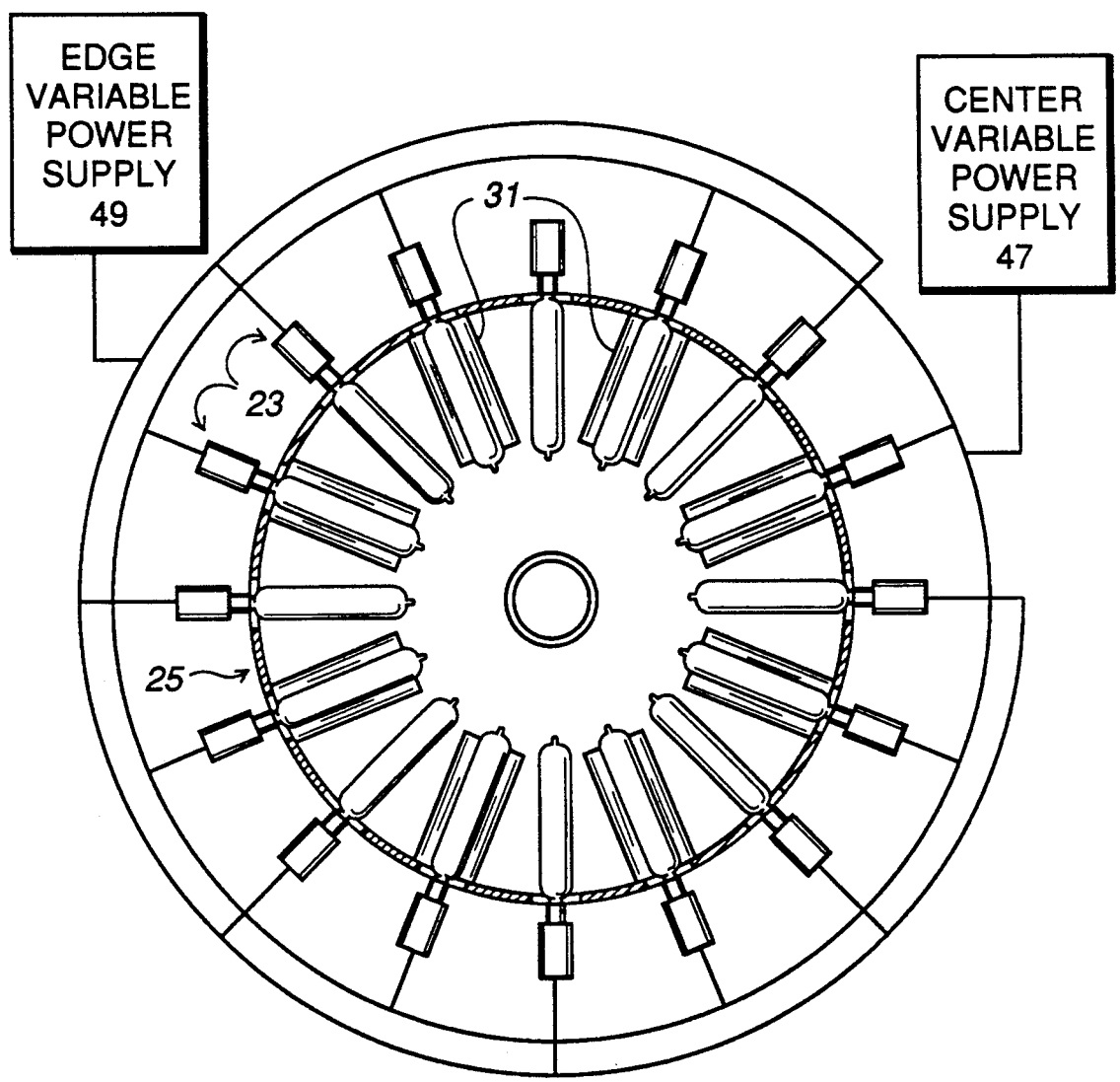
FIG. 2 is an axial end view of the heater apparatus of FIG. 1 from the perspective indicated by lines 2—2 in FIG. 1.

FIG. 2 illustrates in plan view the radial arrangement of heater lamps 23, and also shows that, in accordance with the present invention, alternate heater lamps are provided with focusing type reflectors 31 which will be described in more detail with respect to FIG. 3. The remaining heater lamps are provided with dispersive type reflectors which will be described in more detail with respect to FIGS. 4 and 5. The reflectors are elongated having a major dimension extending the length of the filament in the adjacent heater lamp, and a minor dimension extending traverse to the filament.

The focusing reflectors form a first collection of generally concave reflectors associated with a first collection of heater lamps for directing heating radiations in a first radiation pattern across the center of the susceptor. The dispersive reflectors form a second collection of generally flat reflectors associated with a second collection of heater lamps for directing heating radiations in a second radiation pattern around the edge of the susceptor.

Although FIG. 2 shows 16 of the heater lamps 23, and indicates that every other one (i.e., 8) of them is provided with a focusing reflector, it will be understood that such is for illustrative purposes only, and that the teachings of the present invention extend to any number of heater lamps 23 and focusing reflectors 31. For instance, the dispersive reflectors forming the second collection of reflectors may outnumber the focusing reflectors forming the first collection of reflectors, because the edge area serviced by the dispersive reflectors is much larger than the center area serviced by the focusing reflectors.

Figure 3:
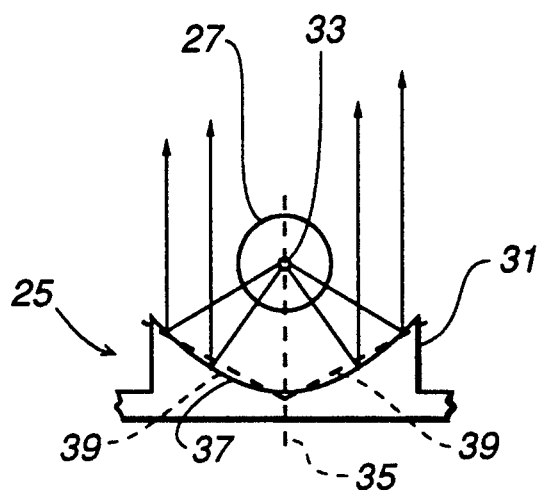
FIG. 3 is a sectional view illustrating a single heater lamp and its associated focusing reflector.

Turning now to FIG. 3, a single lamp 27 together with its associated focusing reflector 31 are illustrated in cross-section. As indicated, reflector 31 is formed as an integral part of extended reflector array 25, for example by processes of casting, machining and the like, followed by plating with a thin layer of gold.

Each point along linear filament 33 of lamp 27 produces thermal radiations uniformly in all directions. A portion of the radiations from any given point extend radially within a plane transverse to the axis of the filament (normal to the plane of the drawing). However, only the rays which strike focusing reflector 31 have been illustrated in FIG. 3. As can be seen in the Figure, these rays emerge, after reflection, parallel to one another and to an axis normal to the reflector array 25, as represented by dotted line 35 in FIG. 3.

Such a radiation pattern is produced by forming the surface 37 of reflector 31 such that it has a parabolic cross-section and by locating filament 33 at the focal axis of the parabola. The rays are reflected generally parallel to the central plane of symmetry of the parabola which extends downwardly through the focal axis and generally normal to the susceptor. Each parabolic reflector produces a band of generally parallel radiation which heats the edge region and the center region of the susceptor. Each band of radiation contributes to the heating of the center region which establishes a more intense heating pattern at the center. The planes of symmetry of the other parabolic reflectors also extend generally normal to the susceptor and have a common intersection along axis 15.

However, much of the total thermal radiation generated by filament 33 will not follow the paths which are illustrated in FIG. 3. In particular, approximately ⅔ of the radiation of filament 33 doesn't impinge upon surface 37, since this surface, as illustrated, subtends an angle of only about 120 degrees at filament 33. Moreover, some of the thermal radiation striking surface 37 travels along ray paths which are not normal to the axis of filament 33. This radiation also will not be focused in accordance with FIG. 3.

For these reasons, the radiation pattern produced by focusing reflector 31 is very much more complex than illustrated in FIG. 3, and the accurate focusing of the indicated rays along paths which are parallel to the axis of the reflector array is not of critical concern. Accordingly, in the interests of economy, it is practical to roughly approximate the complex shape of a parabola by the use of a surface formed by intersecting planes, illustrated by dotted lines 39 in FIG. 3. Similarly, although not illustrated, another general approximation of a parabolic cross section can be achieved by the use of intersecting surfaces which are portions of circular cylinders.

Figure 4:
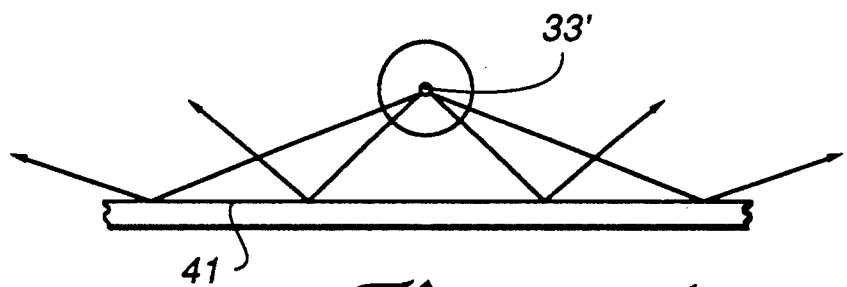
FIG. 4 is a sectional view illustrating a single heater lamp in combination with a planar dispersive reflector.

FIG. 4 illustrates the radiation pattern produced by a planar type of dispersive reflector 41, considering only those rays which travel along paths normal to filament 33'. As can be seen, only those rays which strike reflector 41 nearly normal thereto are reflected in a direction generally normal to the reflector array 25, since reflector 41 has no converging or focusing effect.

Figure 5:
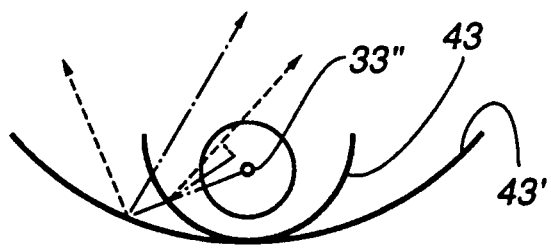
FIG. 5 is a sectional view illustrating a single heater lamp in combination with a cylindrical dispersive reflector.

FIG. 5 illustrates the pattern produced when the regions of reflector array 25 between focusing reflectors 31 are formed as cylinders of circular cross-section. As can be seen, the particular radius of curvature and filament position illustrated in FIG. 5 have resulted in dispersion of the reflected rays.

However, if the radius of curvature of surface 43 in FIG. 5 were to be increased (as indicated by surface 43'), the pattern of reflected rays would first pass through a condition of approximate parallelism as the parabolic focus moved relative to surface 43, and then change to divergence. The actual degree of dispersion produced by the dispersive reflector of FIG. 5 will therefore depend upon the radius of curvature of cylindrical surface 43 and upon the location of filament 33" with respect to surface 43.

From the foregoing discussions, it will be apparent that the pattern of radiation from each lamp and its associated reflector is complex and difficult to analyze. However, the use of two different types of reflectors in accordance with the present invention offers the possibility of altering the radiation patterns in such a way that considerable variation can be achieved on an empirical basis. Accordingly, it is possible to select appropriate reflector configurations and dimensions to optimize thermal uniformity over the surface of the substrate 3 in FIG. 1.

Returning now to FIG. 1, the radiation pattern produced on substrate 3 is considerably influenced by the incorporation of a peripheral reflector 45 in the shape of a cylinder having its axis generally coincident with axis 15. Peripheral reflector 45 is thus positioned to intercept a considerable percentage of the rays traveling along paths which deviate considerably from a direction parallel to axis 15, and to redirect a large percentage of these rays onto substrate 3. Inner reflector 46 also intercepts and redirects deviate rays.

Peripheral reflector 45 further increases the complexity of analysis of the radiation pattern produced on substrate 3, but empirical results show the following:

(1) The radiation pattern produced by focusing reflectors 31 is higher in the center region of substrate 3 than in the peripheral region thereof. This is consistent with the fact that a substantial percentage of the radiation from the focusing reflectors is beamed toward the substrate.

(2) The radiation pattern produced by dispersive reflectors such as planar reflector 41 of FIG. 4 and circular-cylindrical reflector 43 of FIG. 5 is greater in the peripheral region of substrate 3 than in the center region thereof. This is consistent with the greater percentage of rays which diverge from a direction parallel to axis 15 in FIG. 1. Many of these rays impinge on peripheral reflector 45 and are reflected into a pattern of high radiation density in the peripheral region of the substrate 3.

VARIABLE POWER SUPPLY (FIG. 2)

Electrical power supplies provide electrical current for energizing the heating lamps to establish the elevated temperature of the susceptor and wafer. Preferably, the power supplies are adjustable in order to vary the lamp current and control the intensity of the heating radiations from the lamps and balance the heat distribution between the center heating pattern and the edge heating pattern.

First or center power supply 47 controls the energizing current to the first collection of lamps, the lamps with generally concave focusing reflectors. Varying the current from the center power supply varies the heating radiations directed toward the center of the susceptor along the first heating pattern. Second or edge power supply 49 controls the energizing current to the second collection of lamps, the lamps with generally flat dispersive reflectors. Varying the current from the edge power supply varies the heating radiations directed around the edge of the susceptor along the second heating pattern.

Figure 6:
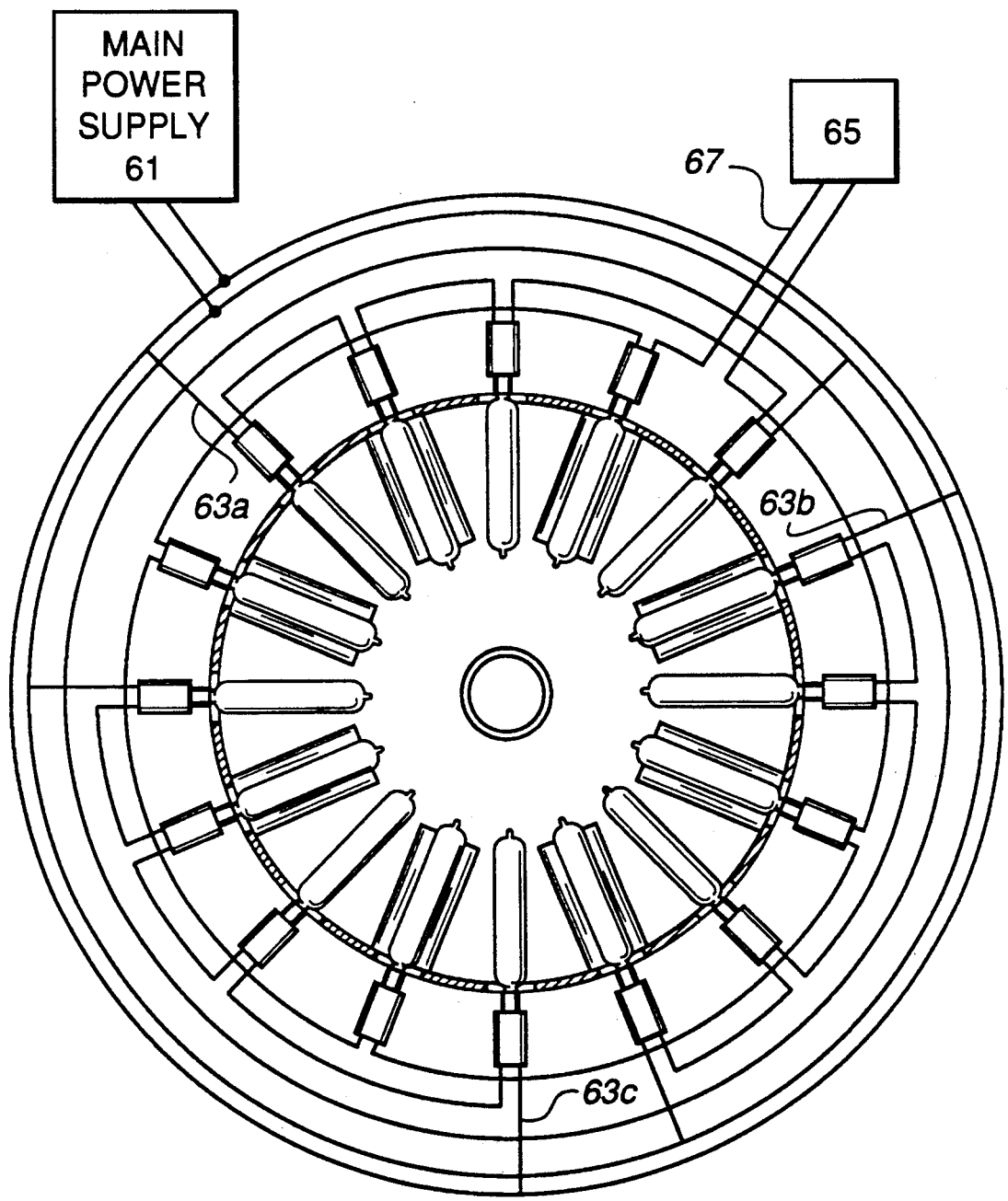
FIG. 6 is an axial end view of a heater apparatus with a main power supply and a balance power supply.

The power supplies may be any suitable adjustable circuit such as a phase angle fired SCR. The heater lamps may have a lower operating voltage than the power supply voltage, and may be connected in series to form strings which are connected across the power supplies. For example, a 480 volt supply may have four 120 volt-16 ampere lamps forming a single string as shown in the embodiment of FIG. 6. This string configuration permits a higher voltage power supply to operate at a lower current load.

MAIN - BALANCE POWER SUPPLIES (FIG. 6)

The lamp load of the variable power supplies need not be allocated on a strictly center pattern or edge pattern basis. Main power supply 61 (see FIG. 6) supplies current to three main strings 63a and 63b and 63c having serially connected lamps from both the center lamp collection and in the edge lamp collection. Balance power supply 65 however supplies current to balance string 67 which has lamps from only the center lamp collection.

The current from main power supply 61 is increased (or decreased) to elevated (or lower) the operating temperature of the susceptor by increasing (or decreasing) the lamp current through the main string lamps. Adjusting the main power supply affects both the center heating pattern and the edge heating pattern because the main string lamps include lamps from the center collection with concave collective reflectors and lamps from the edge collection with planar dispersive reflectors.

Balance power supply 65 is adjusted to balance the heating radiations between the two heating patterns by changing the heat directed along the center heating pattern at the center of the susceptor. All of the heating lamps in balance string 67 are from the center collection. The center heat may be raised or lowered separately from the edge heat by adjusting only balance power supply 65.

In accordance with the present invention, a substantial improvement in uniformity of thermal radiation, and a corresponding improvement in temperature uniformity from center to edge of substrate 3, can be achieved by designing reflector array 25 to include both focusing and dispersive reflectors together with a peripheral reflector. The improvement is produced by balancing the center bias of the focusing reflectors with the peripheral bias of the dispersive reflectors. In this manner, temperature variation across the extent of substrate 3 has been reduced to 2 to 4 Celsius degrees. Moreover, these results have been achieved using only a single peripheral array of heater lamps of a single type, resulting in manufacturing costs which are lower than for the heater arrays known heretofore.

Although this invention has been described with some particularity with respect to embodiments thereof which comprise the best mode known to the inventors for carrying out their invention, many changes could be made and many alternative embodiments could thereby be derived without departing from the scope of the invention. Accordingly, the scope of the invention is to be determined only from the following claims.

We claim:

1. A heater apparatus for directing thermal radiation along an axis of cylindrical symmetry for the apparatus to thermally irradiate a workpiece supported on a susceptor substantially normal to the axis, the heater apparatus comprising:
   a radial array of circumferentially spaced, radially extending elongated heaters lying in a common plane substantially normal to the axis of cylindrical symmetry;
   a plurality of focusing reflectors for focusing radiation on the workpiece from a first group of heaters in the radial array primarily along paths substantially parallel to the axis;
   a plurality of dispersive reflectors for reflecting and dispersing radiation toward the workpiece from a second group of heaters interspersed between heaters in the first group of heaters in the radial array; and
   a cylindrical reflector substantially coaxial with the axis of cylindrical symmetry and located between the radial array of heaters and the workpiece for reflecting to and across the workpiece radiation from the dispersive reflectors.

2. The apparatus of claim 1 further comprising:
   first variable power supply means for the first group of heaters for selectively controlling heat radiated by the first group of heaters relative to heat radiated by the second group of heaters; and
   second variable power supply means for selectively controlling heat radiated by the second group of heaters relative to heat radiated by the first group of heaters, whereby temperatures across an extent of the workpiece between a center and an edge thereof are selectively controllable.

3. The apparatus of claim 1 wherein the apparatus of claim 1 is centered on the axis of cylindrical symmetry and located above a top surface of the workpiece and wherein the heater apparatus further comprises:
   a second radial array of circumferentially spaced, radially extending elongated heaters lying in a common plane below a lower surface of the workpiece and substantially normal to the axis;
   a second plurality of focusing reflectors for focusing radiation onto the lower surface of the workpiece from a first group of heaters in the second radial array primarily along paths substantially parallel to the axis;
   a second plurality of dispersive reflectors for reflecting and dispersing radiation toward the workpiece from a second group of heaters interspersed between heaters in the first group of heaters in the second radial array; and
   a second cylindrical reflector substantially coaxial with the axis of cylindrical symmetry and located between the second array of heaters and the workpiece for reflecting to and across the workpiece radiation from the second dispersive reflectors.

4. In a chemical vapor deposition apparatus, a method of directing thermal radiation to a planar disk-shaped substrate supported on a susceptor substantially normal to an axis of radiation passing through a center of the substrate comprising:
   in a plane substantially normal to the axis of radiation generating radiation form an array of separated radially extending heaters;
   focusing radiation from ones of the heaters to the substrate primarily along paths substantially parallel to the axis;
   dispersing radiation toward the substrate from others of the heaters; and
   collecting dispersed radiation with a cylindrical reflector substantially coaxial with the axis of radiation and reflecting the collected radiation toward an outer edge of and across an extent of the substrate between the center and the edge of the substrate.

5. The method of claim 4 further comprising selectively varying the radiation from the ones and the others of the heaters to control temperatures across the extent of the substrate.

* * * * *